US006037677A

United States Patent [19]
Gottschall et al.

[11] Patent Number: 6,037,677
[45] Date of Patent: Mar. 14, 2000

[54] DUAL-PITCH PERIMETER FLIP-CHIP FOOTPRINT FOR HIGH INTEGRATION ASICS

[75] Inventors: Robert A. Gottschall, Vestal; Roger P. Gregor, Endicott; James P. Libous, Endwell, all of N.Y.

[73] Assignee: International Business Machines Corporation, Armonk, N.Y.

[21] Appl. No.: 09/321,894

[22] Filed: May 28, 1999

[51] Int. Cl.$^7$ ....................................................... H02J 1/00
[52] U.S. Cl. ........................... 307/43; 361/772; 361/805
[58] Field of Search ............................... 307/43, 80, 147, 307/149, 150; 361/748, 760, 772, 774, 777, 780, 794, 805; 174/260, 261; 257/773, 774

[56] References Cited

U.S. PATENT DOCUMENTS

| | | |
|---|---|---|
| 4,600,970 | 7/1986 | Bauer . |
| 5,061,989 | 10/1991 | Yen et al. . |
| 5,220,490 | 6/1993 | Weigler et al. .......................... 361/409 |
| 5,255,156 | 10/1993 | Chang ....................................... 361/783 |
| 5,424,492 | 6/1995 | Petty et al. . |
| 5,557,505 | 9/1996 | Silva . |
| 5,604,330 | 2/1997 | Hasan et al. . |
| 5,682,297 | 10/1997 | Silva . |
| 5,751,554 | 5/1998 | Williams et al. . |
| 5,767,575 | 6/1998 | Lan et al. ................................ 257/701 |
| 5,946,552 | 8/1999 | Bird et al. ............................... 438/107 |

OTHER PUBLICATIONS

Mixed Lead Pitch/Pad Geometry for Surface Mount Technology, IBM Technical Disclosure Bulletin, vol. 32, No. 5A, Oct. 1989.

*Primary Examiner*—Jeffrey Gaffin
*Assistant Examiner*—Peter Zura
*Attorney, Agent, or Firm*—Whitham, Curtis & Whitham; John R. Pivnichny

[57] ABSTRACT

A connection array for a chip provides a substantial increase in numbers of signal connection locations and a power distribution arrangement of improved robustness and noise immunity while accommodating multiple power supply voltages by providing pairs of sub-arrays aligned with chip edges and signal connection locations formed in columns orthogonal to a chip edge or segment of the chip perimeter. Signal connections in a column are spaced at a first pitch and columns of signal connections are spaced at a second pitch. Power connections corresponding to different power supply voltages are provided between columns of signal connections and along rows which are centered between rows of signal connections generally parallel to an edge of a chip. Power distribution layers may be formed as a mesh which extends in under the chip in alignment with power connections to the chip and beyond the perimeter of the chip, as well to provide multiple low-impedance power delivery paths to improve noise immunity. The connection pattern allows fewer layers of redistribution wiring to be used to escape the chip, reducing overall product cost. Thus improvements in functionality and performance can be supported at reduced cost, particularly for custom designed application specific integrated circuits.

21 Claims, 6 Drawing Sheets

- ORI
- SIG
- PWR

⊙ – SIG  ⊕ – VDD
◎ – ORI  ⊕ – VDD2
⊗ – GND

DUAL-PITCH PERIMETER FLIP-CHIP FOOTPRINT FOR HIGH INTEGRATION ASICS

BACKGROUND OF THE INVENTION

1. Field of the Invention

The present invention generally relates to integrated circuit packaging and, more particularly, to the provision of module and package designs of increased economy of manufacture and increased chip connection density.

2. Description of the Prior Art

It has been recognized that increased device (e.g. transistors, capacitors and the like) density in integrated circuits yields substantial performance benefits as well as manufacturing economies. The increased proximity of devices leads to improvements in noise immunity while decreasing signal propagation time between devices. Increased numbers of devices per chip leads to increases in reliability, manufacturing yield and functionality of chips operating at reduced voltage to reduce power. Economies in manufacture derive from the development of greater numbers of devices with a given sequence of manufacturing process steps. Similar benefits are derived from packaging chips more compactly in modular packages, sometimes including and providing connections between hundreds of discrete chips in a single modular package.

These pressures toward increased integration density of integrated circuit chips and the development of new technologies in support thereof have established a trend which now leads to an expectation of 100% increase in integration density, 30% reduction in operating voltage and 20% increase in performance every eighteen months. However, increases in functionality of integrated circuit chips cannot be exploited without provision of adequate signal input and output (I/O) communication paths to and from the chip(s). Further, substantial power must be supplied thereto and power distribution on the chip consumes valuable space and may compromise reliability of fine connections through mechanisms such as metal migration in narrow and closely spaced conductors subjected to large temperature excursions. Further, multiple supply voltages are currently employed to manage power consumption and dissipation requirements of chips and to provide interface voltage compatibility with other chip technologies.

It is also convenient to generally standardize connection dimensions for both signals and power to simplify connection techniques (e.g. using solder preforms) and the current which can be carried by each connection is limited. Therefore, it is not uncommon for one-quarter to one-third of all connections to a chip to be dedicated to power supply or ground connections. Since a minimum spacing of connections must be provided, the number of power connections restrict the number of signal connections that can be made to a chip of a given area.

These trends and conflicting limitations apply to both production integrated circuit packages having more-or-less standardized designs such as processors, memories, memory controllers and the like, some of which are collectively referred to as chip sets, and to so-called application specific integrated circuits (ASICs) which are manufactured to a customer's specifications of function but generally utilize a standardized interface (e.g. pin-out) hardware and other industry standard specifications so that the amount of customized hardware can be held to a minimum to minimize customer costs in constructing the equipment in which ASICs may be employed.

For this reason, some design criteria are more difficult to meet for ASICs than for production integrated circuits. Since ASICs are, by their nature, custom-fabricated devices they are expensive and the I/O requirements must be designed with a view to the requirements and economy of production of the equipment in which they are to be used. Therefore, it is common practice to design I/O connections to make maximal use of standard integrated circuit hardware to support the functions of the ASICs to the limit imposed by overall custom function and physical requirements.

While production integrated circuits can be increased in scale to reduce pin-out numbers (theoretically to multi-byte input, output and control ports and a single power supply) such an approach in an ASICs design where the cost can only be amortized over a relatively small number of packages may be prohibitively expensive. Accordingly, increased chip functionality almost invariably leads to increased number of required I/O connections in ASICS, often referred to as Rents Rule, to allow the functions provided by an ASIC to communicate with circuits which are off the chip.

Merely increasing chip size or connection density or utilizing the entire chip footprint, which have been the traditional approaches to date, does not provide a viable solution to the need for increased connections to ASIC chips or packages at the present state of the art. As alluded to above, non-standard or custom connection patterns increase the cost of manufacture of ASICs and devices which include them even if the change is within the capability of a mature technology. Non-standard hardware can also greatly increase costs. Development of new technologies to accommodate custom ASIC designs would almost necessarily be prohibitive in cost and would greatly delay delivery time as well as raise unacceptable uncertainties in regard to delivery dates and the capacity of a manufacturer to deliver the ASICs according to the specified design.

In regard to the packaging of integrated circuit chips, a problem is presented by the need to provide wiring from individual chip connections generally provided at a very fine pitch to pin or connection locations on the package where connections are made from the package to a circuit board or other support structure. These latter connections are generally provided at a much more coarse pitch than connections on a chip which are too closely spaced for a suitably robust conductor to be passed between.

Therefore, a number of layers of connections are necessary in the chip package to provide an array of suitable wiring connections to "escape" the chip. The number of layers of wiring required generally must increase with the number and types (e.g. signals and plural power supplies) of connections which must be made and the complexity of alignment and routing of connections of respective types on respective layers. For example, to escape from a conventional connection pattern shown in FIG. 1 and which will be described in greater detail below, twelve connection layers are required to provide good electrical performance. It can be readily appreciated that the number of layers which must be provided constitutes a significant portion of the package expense.

Conductor routing in the packaging also affects chip performance. Generally, it is common practice to provide a mesh of conductors for each power supply (e.g. V1, V2, Ground) in different levels below the area where the chip or die is to be attached and connected. Another mesh or conductor pattern is generally provided outside the chip or die area and, for current chip connection patterns such as that of FIG. 1, the mesh under the chip is not aligned with and not easily connectable directly to the conductor pattern outside the chip or die area. The additional connection hardware and/or connection length leads to resistive voltage drops and inductive "delta-I" drops and are thus likely sources of noise and ambiguous logic value voltages is which may compromise chip performance.

SUMMARY OF THE INVENTION

It is therefore an object of the present invention to provide a chip connection pattern which provides an increased number of potential connection locations for a given chip area and dimensions.

It is another object of the present invention to provide a chip connection pattern which requires fewer connection layers in chip or module packaging to escape the chip.

It is a further object of the present invention to provide a chip connection pattern which is compatible with present and foreseeable technologies, particularly those feasible for fabrication of ASICs and circuits utilizing more than two power supplies, which provides a robust power connection system that does not compromise but improves chip performance.

In order to accomplish these and other objects of the invention, a connection array and electronic circuit package employing the array are provided including a plurality of columns of connection locations extending in a direction orthogonal to a segment of a perimeter of a chip, respective connection locations in a column being spaced at a first pitch orthogonally to the segment of the perimeter of said chip to form rows generally parallel to an edge of the chip and columns of connection locations being spaced by a second pitch larger than said first pitch, and further connection locations located interstitially between the columns of connection locations and in rows centered between the rows and on lines angled at approximately thirty degrees to the chip edge. Power connections assignments improve noise immunity and flexibility.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
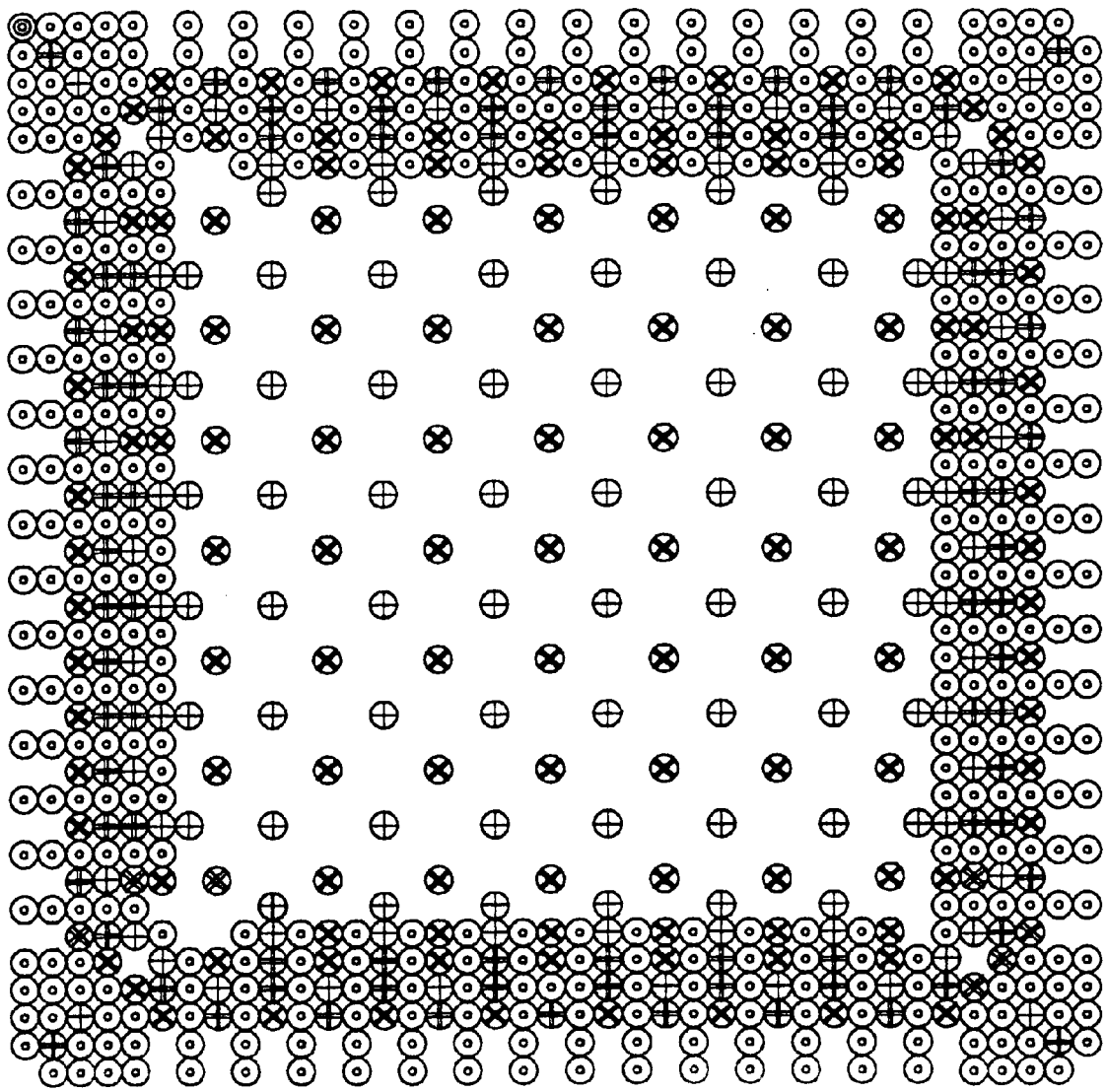
FIG. 1 is a plan view of a conventional single pitch chip connection pattern.

Referring now to the drawings, and more particularly to FIG. 1, there is shown, for purposes of comparison with the invention, a conventional single pitch connection pattern 10 (referred to as a CMOS5 C4 pattern) as would be used on a 9.1 mm square chip. This pattern provides a single connection pitch (e.g. center-to-center spacing) in directions parallel and perpendicular to edges of the chip. Connections are preferably made by so-called C4 preforms which have been an industry standard for a number of years. Current mature silicon, C4 and package technologies support a connection pitch of 225 microns and a slightly larger pitch of 230.4 microns is employed in the CMOS5 pattern of FIG. 1. A pitch of approximately these dimensions is compatible with multiple chip design rules (e.g. 0.4, 0.35 and 0.25 micron minimum feature sizes).

While this pitch provides a 39×39 matrix of potential connection locations, it is common practice to utilize only a limited number of potential locations in the central region of the chip for power connections and to concentrate signal connections near the periphery of the chip. Placement of additional signal connections in the central area of the chip increases the number of redistribution layers required in the packaging in order to "escape" the chip, thereby increasing overall product cost. Power connections 12a, 12b, 12c must be made periodically over the chip area to minimize resistive and inductive voltage drops and chip space used for power distribution and to increase noise immunity. In the case of the CMOS5 pattern, two power supply voltages and ground are accommodated by connections 12a, 12c and 12b, respectively, as indicated by the symbols "VDD", "VDD2" and "GND" thereon.

Additionally, to minimize capacitive signal coupling between signal lines, power supply connections 12a, 12b, 12c are generally interposed between signal connections 14 to provide a degree of shielding therebetween. When no power connection is made between signal connections, the center-to-center spacing of signal connections (e.g. 16) is doubled in many locations to improve signal escape and thereby minimize package layer count. Where there are fewer signal connections per unit length of perimeter, such as in the corners of the connection pattern, signal connections can be made at locations separated by the single pitch of the pattern.

Thus the CMOS5 pattern of FIG. 1 provides only 408 signal connection locations. The addition of further signal connection locations in the central area of the chip increases costs of chip design and fabrication, and is not economically practical, particularly for custom-designed ASICs since additional, centrally located connection locations require additional layers in the packaging, as alluded to above. Increasing area of the chip to provide additional signal connection locations using a similar single pitch pattern increases chip fabrication costs and is similarly not economically feasible, especially for ASICs.

Figure 5:
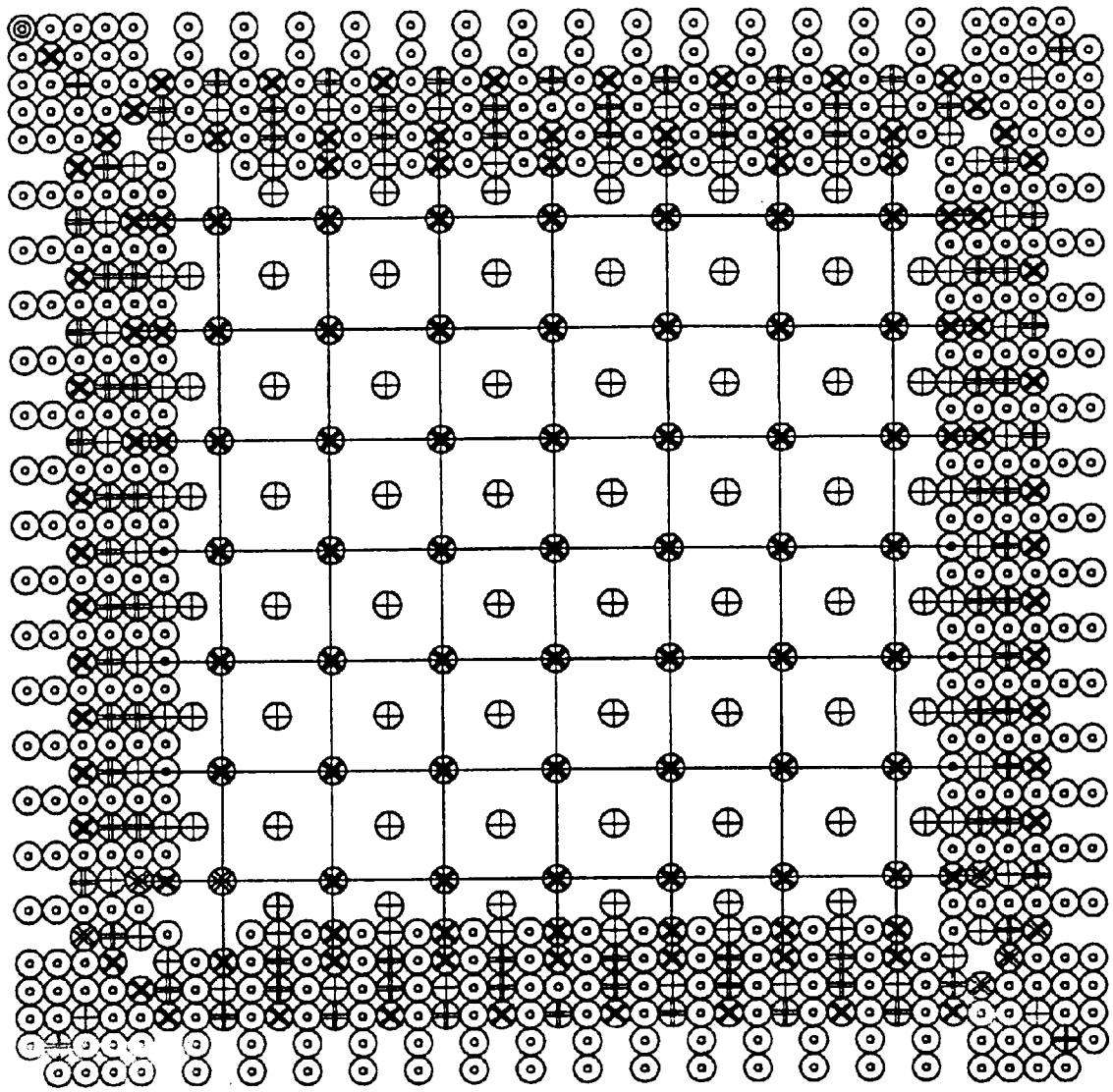
FIG. 5 is the conventional single pitch chip connection pattern of FIG. 1 showing current power grid connection alignment.

It should also be noted from FIG. 1 that maximizing the number of signal connection locations or the addition of a second supply necessarily places signal connection locations or second supply connection locations (e.g. 14a) in alignment with power connections. Therefore, the power connection grid in connection layers of the packaging in areas under the chip or die cannot be aligned with power connections outside that area since the signal connections so aligned must be accommodated and block direct power connections. As can be seen from FIG. 5, the power grid under the chip or die must be terminated at connection location 32 (or 36) to avoid interference with power connection 34. This practical requirement increases length and complexity of power connections, compromising noise immunity and package manufacturing yield and engendering resistive and inductive voltage drops.

Thus it can be seen that single pitch connection patterns, of which the CMOS5 pattern is exemplary, represents numerous compromises and limitations to which the only alternative is substantial increase of product cost. Moreover, full potential performance of the chip is compromised to some degree by such a single pitch connection pattern while unavoidable complexity undoubtedly compromises manufacturing yield.

Figure 2:
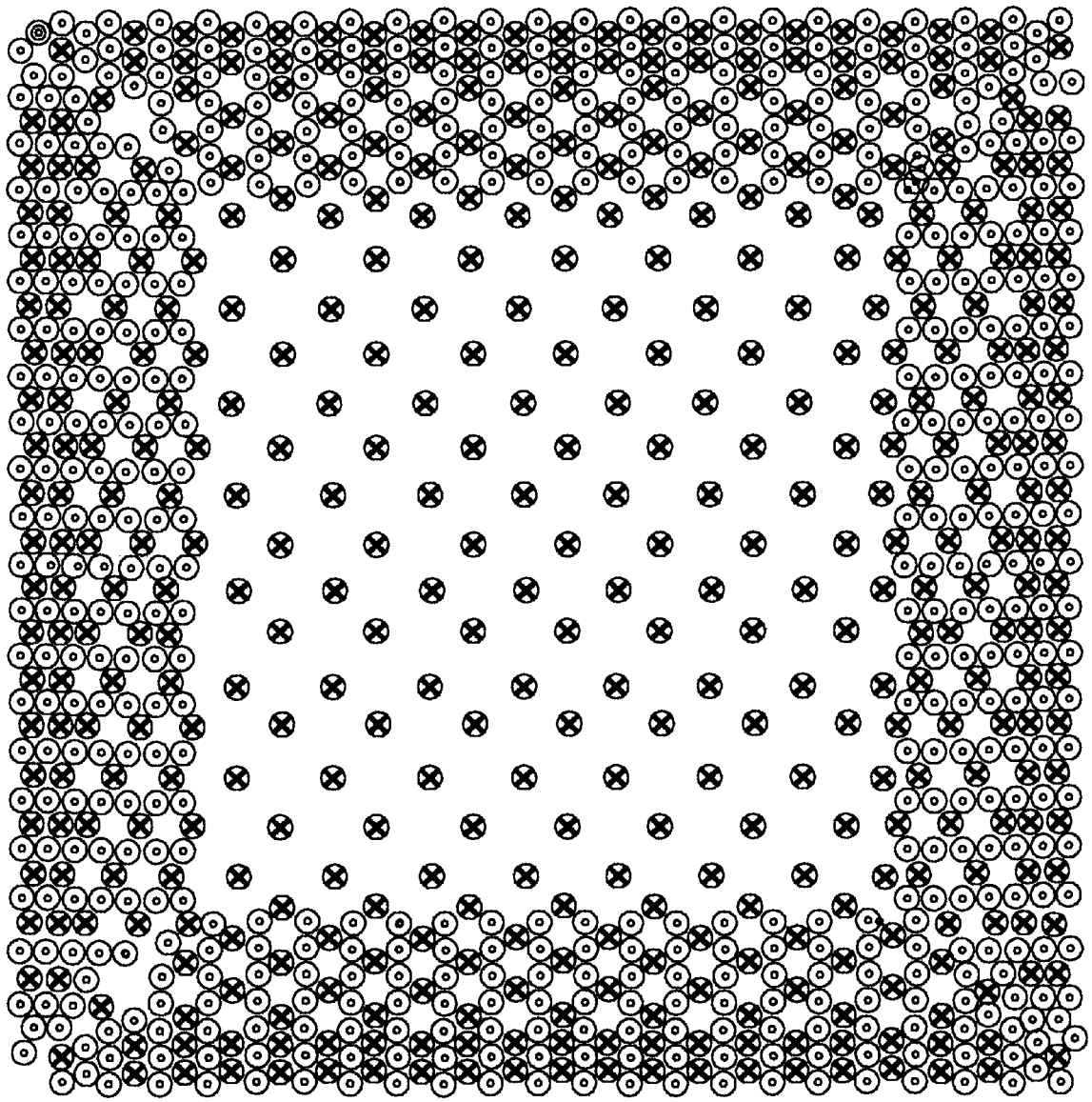
FIG. 2 is a plan view of a dual pitch chip connection pattern in accordance with the invention.

Referring now to FIG. 2, a dual-pitch connection pattern in accordance with the invention is shown. It should be understood that the principles of the invention can be applied to provide connection patterns which will realize the meritorious effects of the invention for chips or dies of many different dimensions and the pattern illustrated is preferred for a 9.2 mm square chip and is provided for ease of comparison with the pattern of FIG. 1.

In contrast with the CMOS5 connection pattern of FIG. 1 which provided a single pitch in both coordinate directions (e.g. X and Y), the connection pattern 20 of FIG. 2 in accordance with the invention provides different pitches in directions parallel and perpendicular to each edge (e.g. a segment of a perimeter) of the chip, respectively. It should be appreciated that the pattern 20 comprises four sub-arrays which are identical (or two pairs of identical arrays which may differ between pairs for rectangular chips). Each sub-array is truncated at the corners of the chip to avoid interference between sub-arrays and connection locations may be freely placed, as may be convenient, in these regions.

In accordance with the general principles of the invention, the signal connections 22 are placed in columns 21 perpendicular to each edge of the chip to form a plurality of rows (in this case, seven) 29. As can be appreciated, the rows 29 of signal connections are more closely spaced than the columns 21. Power connections 24, 26, 28 are placed interstitially between columns of signal connections and at locations along lines which are mid-way between rows 29 of signal connections in a substantially a close-packed array with power connections and signal connections alternating along lines 27 angled at 30 degrees to the edge of the chip. Power connections are omitted at some locations along some of these lines because robust chip power distribution does not require a fully populated array of power connections and package yield is enhanced by reducing connection density. Thus, all common power connections 24, 26, 28 are aligned in respective groups. It is also possible to provide different power supplies for either VDD1 or VDD2 in one or more different respective sub-arrays while a common power supply can also be provided for the entire chip.

For the illustrated pattern provided for the 9.2 mm square chip, the pitch of signal connections in a direction perpendicular to an edge of the chip is 226.8 microns (only about two percent less than the 230.4 micron single pitch of the CMOS5 pattern of FIG. 1). The minimum spacing between different power supply connections is also 226.8 microns. The pitch between columns 21 of signal connections and columns 23 of power connections is 403.2 microns. This connection pattern 20 provides 624 signal connections; a fifty-three percent increase over the number of signal connections provided by the single pitch connection pattern of FIG. 1 for chips of substantially the same overall dimensions. The shielding effects of interleaving power and signal connections is retained in pattern 20 and the finer pitch of the dual pitch pattern remains compatible with several generations of semiconductor feature size design rule regimes.

In addition to the substantial increase in the number of available signal connections and the increase in chip functionality that can thus be accommodated, the pattern in accordance with the invention provides several additional advantages in performance and manufacturing economy over the CMOS5 connection pattern. It should be appreciated that the formation of the pattern, itself, can be produced by the same steps used to produce any other pattern and thus carries no economic penalty or trade-off while avoiding increased expense of increased chip area and/or increased layers of redistribution wiring in the packaging of the chip. The advantages in performance and manufacturing economy similarly do not require a trade-off in regard to any other known patterns.

First, as alluded to above, the proportionate increase of chip functionality, with reasonably good design, may often exceed the percentage increase of signal connections. This can be readily understood from the fact that, in theory, only input (e.g. data and control) and output (e.g. final results) signals need be communicated to or from the chip while connections internal to the chip to produce desired functions can be proliferated substantially at will in both numbers and complexity. In practice, however, greater functionality generally requires greater data bandwidth of the signal connections, resulting in an increase in the required number of signal connections. Nevertheless, the increase of chip functionality that can be accommodated by a fifty-three percent increase in signal connections may easily be three to four or more times that previously possible.

Second, the magnitude of the advantage of avoiding a need for increased chip area to provide a similar number of signal connections is not well-reflected by the increase of numbers of signal connection locations. That is, to provide an equal number of signal connection locations by increasing chip size and using a single pitch connection pattern similar to that of FIG. 1 would require a 13 mm square chip of approximately twice the area. Accordingly, the economic advantage in cost of chip fabrication to obtain similar numbers of signal connection locations is at least a factor of two.

Third, The connection pattern 20 in accordance with the invention provides enhanced flexibility by more easily accommodating multiple power supply voltages from off the chip. As alluded to above, modern integrated circuits formed at high integration densities often are designed to operate at reduced power supply voltages to allow decrease in size of active devices without breakdown and to limit heat dissipation requirements as greater numbers of active devices are formed on a single chip of given dimensions. The connection pattern 20 provides spatially periodic access to at least two power supply voltages and ground over the entirety of the chip.

Since the pattern 20 can be considered as being formed of four identical and generally symmetrical (e.g. with diagonals) sub-arrays, connection allocations and the corresponding meshes in the packaging can easily be articulated to provide different power supply voltages in different regions of the chip. Up to five (e.g. one corresponding to Vdd1 over the entire chip and four corresponding to Vdd2 in different sub-arrays) or even eight (two for each sub-array) power supplies can be easily accommodated. Special connection allocations are also possible.

Fourth, it has been found by the inventors that the number of layers of redistribution wiring required in packaging of the chip utilizing connection pattern 20 can actually be reduced relative to the number required by pattern 10. As is well-understood in the art, redistribution wiring basically provides connections between connection location on the chip between via locations which are generally directly beneath the chip connection locations to a more spatially distributed array of connection points. These connections cannot overlap or occupy the same location in any given layer of, for example, a ceramic ball grid array package.

As pointed out above, the minimum distance between connection locations (and, hence, via locations) in pattern 20 is only slightly reduced from that of FIG. 1 while the close-nested array serves to increase the total number of available paths between the vias by alternating power escape, signal escape, ground escape, signal escape, . . . etc. layers in the package such that each signal layer is sandwiched between power layers in the package, thus reducing noise and removing the need for additional noise reduction layers which are required by pattern 10. As a consequence, only four redistribution wiring layers are sufficient to escape a chip using pattern 20. Even when the mesh plane requirements for power connections are taken into account, the total package layer count does not exceed ten layers as compared with twelve layers required for redistribution wiring for a chip using the connection pattern of FIG. 1. Since the redistribution wiring must be spaced from the vias which are spaced slightly more closely than in pattern 10, some reduction in redistribution wiring may be necessary but would be less than 10%, which is not considered to be significant in terms of resistance, manufacturing yield, product reliability or performance.

Figure 6:
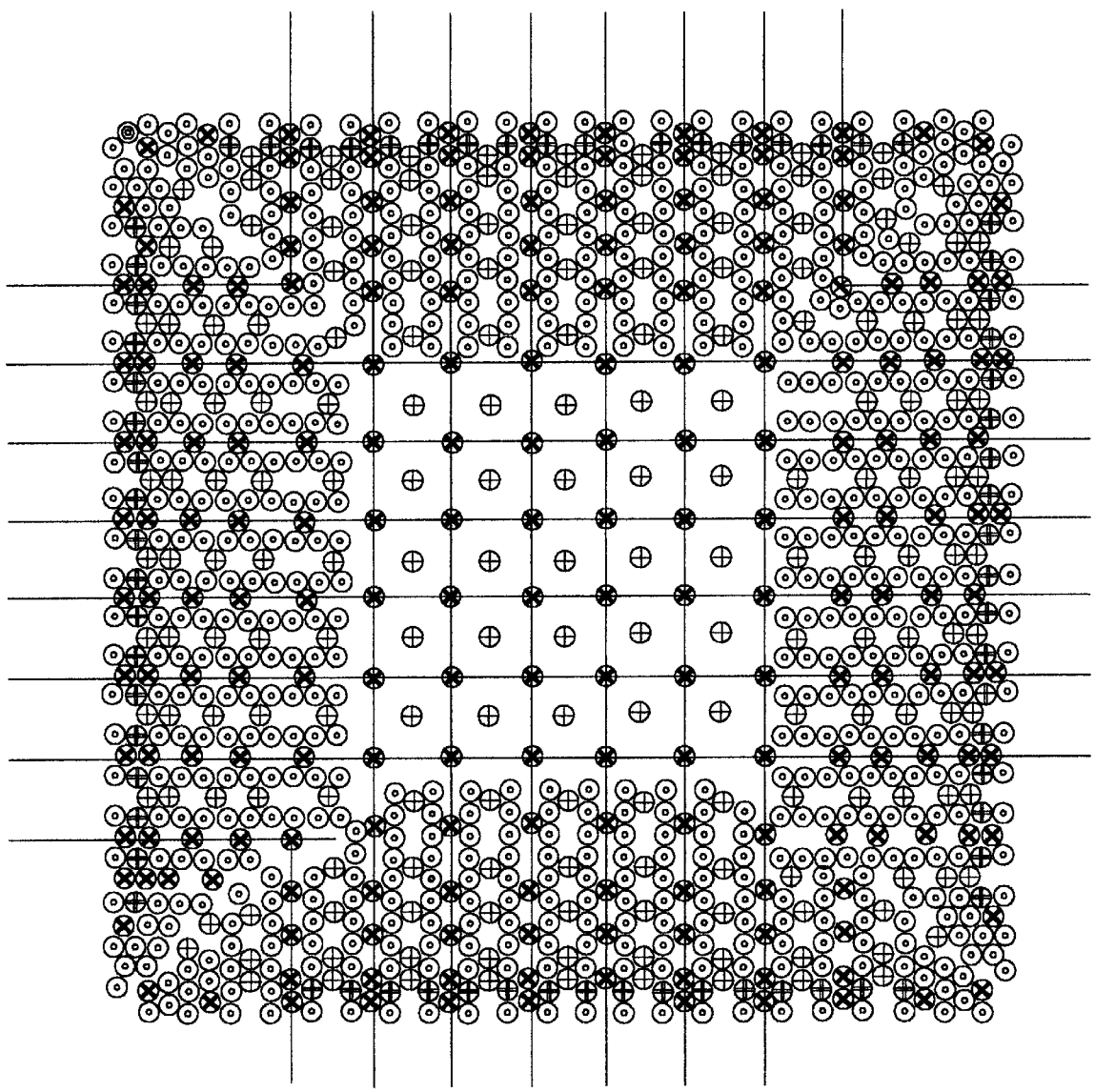
FIG. 6 illustrates the dual pitch connection pattern of FIG. 4 showing power grid connection alignment in accordance with the invention.

Fifth, referring to FIG. 6, the connection pattern 20 in accordance with the invention provides critical functional and performance benefits. A prudent assignment of the power supply connection locations provides a very robust power distribution system for the chip. The metal busses on the chip which feed power to the input and output cells on the chip lie directly below their respective connection locations and provides a decrease in IR and inductive delta-I drops relative to the CMOS5 pattern. The power supply connection allocations also allow the mesh design outside the chip area of the package layers to be continued under the chip. Therefore, multiple low-impedance paths are provided between the power source(s) and areas of the chip to carry large switching currents with improved noise immunity. The shielding effects of interposing power supply connections between signal connections is also improved by the low impedance of the power delivery connections so that switching noise appearing on the power connections is greatly reduced.

Figure 3:
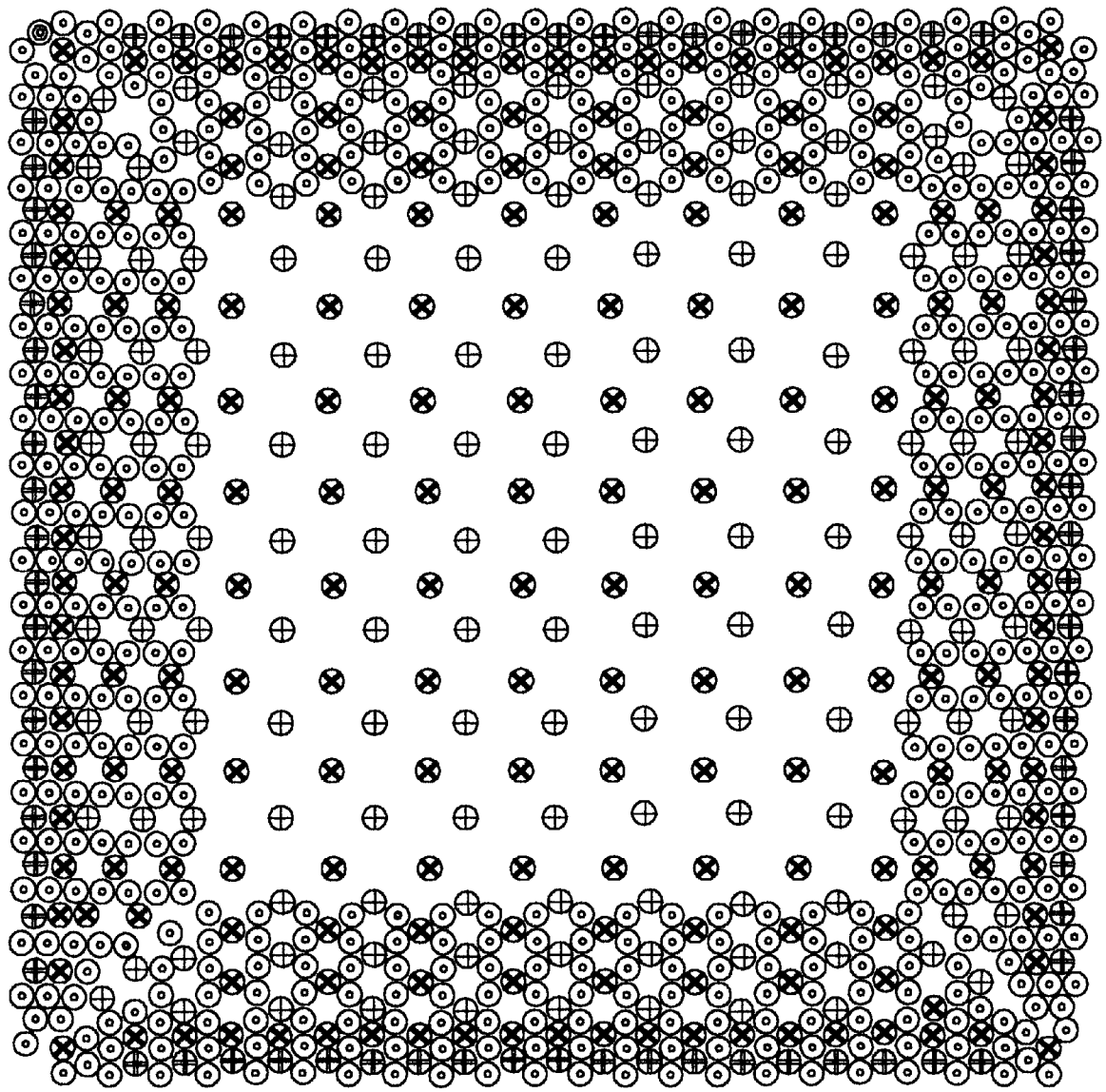
FIG. 3 is the dual pitch chip connection pattern of FIG. 2 showing power grid connection alignment in accordance with the invention.

Sixth, referring to FIG. 3, by assigning the VDD2 as the connection closest to the chip edge in each power column, assigning GND/reference voltage to the second connection in from the edge in each power column, and, only in alternating power columns assigning the third connection in from the edge as another voltage, VDD, a very efficient redistribution method is attainable, especially for CBGA (ceramic ball grid array) packages. In the first package layer, VDD2 is escaped into a mesh outside the chip perimeter. In the second layer, the first two signals/connections from the chip edge are escaped. The third layer escapes GND and provides a complete mesh. The fourth layer escapes the third and fourth signals/connections from the chip edge in the signal columns. The fifth layer escapes the VDD connections and provides a complete mesh for the VDD (over chip regions which receive the same voltage). The sixth layer escapes the fifth and sixth signals/connections, the seventh layer is a second complete GND mesh and the eighth layer escapes the seventh and eighth signals/connections from the chip or pattern edge (if available on the chip) and the ninth layer can be either VDD or VDD2. The bottom/tenth layer is for the pads of the package ball grid array. Thus each signal layer is sandwiched between a voltage layer and a GND layer to minimize noise coupling between signals.

Figure 4:
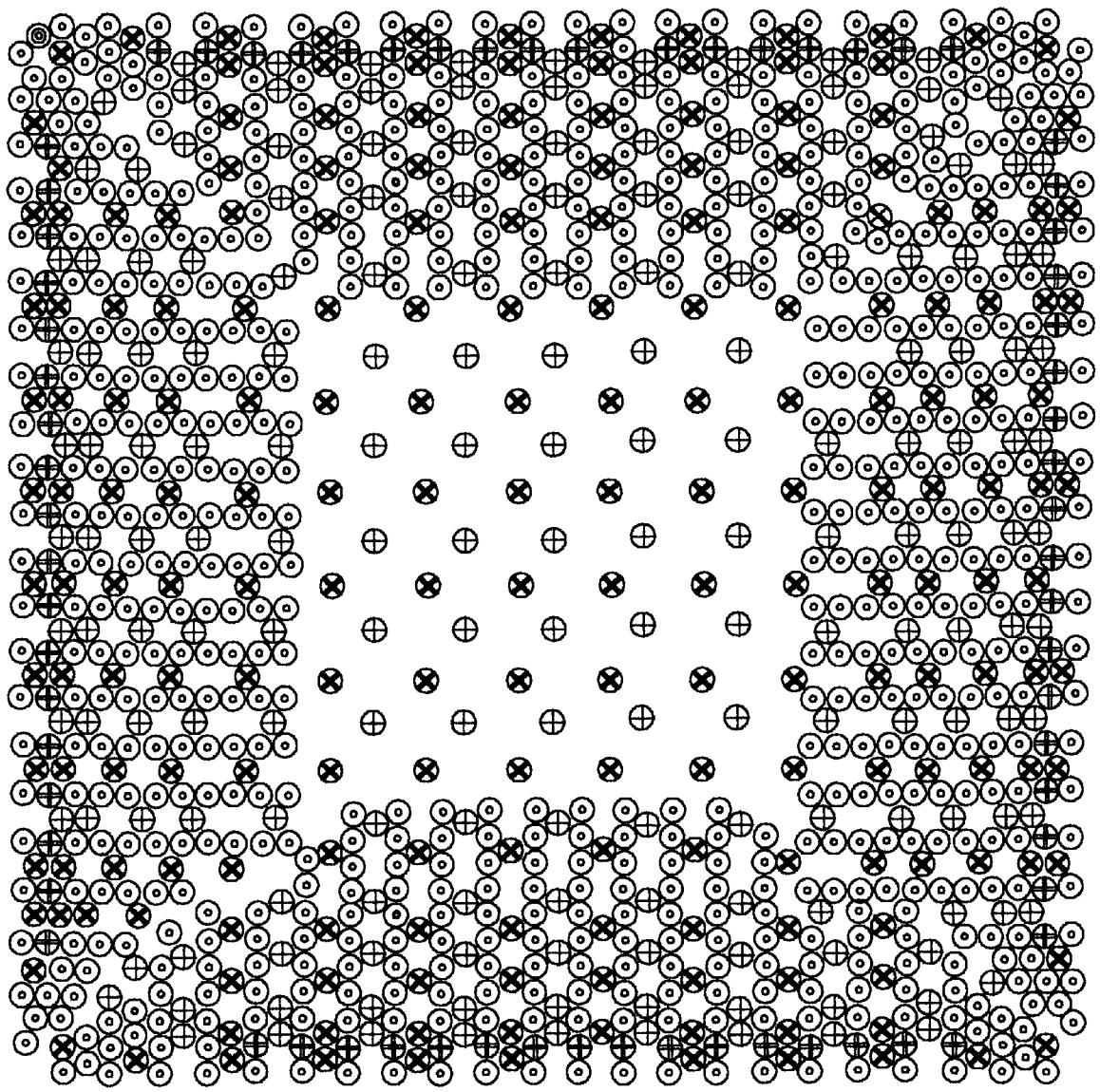
FIG. 4 illustrates an alternative power connection pattern which improves power distribution and packaging flexibility.

Seventh, as a modification of FIG. 3, an alternative power assignment is shown in FIG. 4 which improves the flexibility of package design and noise immunity of the connection assignment of FIG. 3. In FIG. 4, alternating power columns contain either VDD or VDD2 exclusively. This allows extra mesh layers of GND, VDD and VDD2 to be placed as the first three layers of the package, if necessary, to provide a low inductance path to decoupling capacitors placed outside the perimeter of the chip. The first VDD connection is placed one row in from the chip edge to permit the VDD2 to escape between the VDD and the first signal connection. This allows an identical redistribution layer pattern as that explained for FIG. 3. An added advantage of the assignment pattern of FIG. 4 is that the VDD is now one row closer to the chip/pattern edge than in FIG. 3 and therefore provides better power distribution to functions or logic near the chip edge.

In view of the foregoing, it is seen that the invention provides a solution to the problems of providing additional signal connection locations for a chip or die that is not only cost-effective but provides substantial economies in design and manufacture, particularly for ASICs where the economies result in significantly reduced product cost, as well as performance benefits. The connection pattern in accordance with the invention also provides increased flexibility of design, accommodates plural off-chip power supplies and voltage levels and provides improved power delivery in a manner which increases noise immunity.

While the invention has been described in terms of a single preferred embodiment, those skilled in the art will recognize that the invention can be practiced with modification within the spirit and scope of the appended claims. For example, the principles of the invention are not limited to single square or rectangular chips but to combinations of chips (e.g. stacks) and to other polygonal chip shapes such as triangles, hexagons, octagons or the like and to other articulations of sub-arrays for connection to different logic functions, operations, storage (e.g. memories and functions included therein such as decoders and sense amplifiers) and the like which may be formed on chips in any configuration.

Having thus described my invention, what we claim as new and desire to secure by Letters Patent is as follows:

1. A connection array for an integrated circuit chip including a plurality of columns of connection locations extending in a direction orthogonal to a segment of a perimeter of said chip, respective ones of said connection locations in a column being spaced at a first pitch orthogonally to said segment of said perimeter of said chip to form rows generally parallel to said segment of said perimeter of said chip, said columns of connection locations being spaced by a second pitch larger than said first pitch, and further connection locations located interstitially between said columns of connection locations and in rows centered between said rows generally parallel to said segment of said perimeter of said chip and on lines angled at approximately thirty degrees to said segment of said perimeter of said chip.

2. A connection array for an integrated circuit chip including a plurality of columns of signal connection locations extending in a direction orthogonal to a segment of a perimeter of said chip, respective ones of said connection locations in a column being spaced at a first pitch orthogonally to said segment of said perimeter of said chip to form rows generally parallel to said segment of said perimeter of said chip, said columns of connection locations being spaced by a second pitch larger than said first pitch, and power connection locations located interstitially between said columns of connection locations and in rows centered between said rows generally parallel to said segment of said perimeter of said chip.

3. An integrated circuit package as recited in claim 2, wherein a first power supply voltage connection is made at a first connection location nearest the chip edge in a power column, a second power supply voltage connection is made at a second connection location adjacent said first connection location in said power column and a third power supply voltage connection or a further second power supply voltage connection is made at a third connection location adjacent said second connection location in said power column.

4. An integrated circuit package as recited in claim 3, wherein connections of said second power supply voltage and said third power supply voltage are formed in alternating connection locations in said power column.

5. An integrated circuit package as recited in claim 3, wherein said second power supply voltage is a reference voltage.

6. An integrated circuit package as recited in claim 4, wherein said second power supply voltage is a reference voltage.

7. An integrated circuit package as recited in claim 2, wherein first power supply voltage connections and second power supply voltage connections are made in alternating columns.

8. An integrated circuit package as recited in claim 7, wherein said second power supply voltage connections are made in a second row from an edge of said chip connection pattern.

9. An integrated circuit package as recited in claim 8, wherein third power supply voltage connections are located at a connection location adjacent a connection location at an edge of said chip connection pattern in signal columns.

10. An integrated circuit package including a chip having a connection pattern for connection with power and redistribution wiring, said connection pattern comprising a plurality of columns of signal connection locations extending in a direction orthogonal to a segment of a perimeter of said chip, respective ones of said connection locations in a column being spaced at a first pitch orthogonally to said segment of said perimeter of said chip to form rows generally parallel to said segment of said perimeter of said chip, said columns of connection locations being spaced by a second pitch larger than said first pitch, and power connection locations located in power columns interstitially between said columns of connection locations, and a plurality of power distribution and signal redistribution layers in which a power distribution layer includes connections formed as a mesh which extends beneath and beyond said perimeter of said chip and connections of said mesh extend in alignment with power locations corresponding to a power supply voltage.

11. An integrated circuit package as recited in claim 10, wherein a first power supply voltage connection is made at a first connection location nearest the chip edge in a power column, a second power supply voltage connection is made at a second connection location adjacent said first connection location in said power column and a third power supply voltage connection or a further second power supply voltage connection is made at a third connection location adjacent said second connection location in said power column.

12. An integrated circuit package as recited in claim 11, wherein connections of said second power supply voltage and said third power supply voltage are formed in alternating connection locations in said power column.

13. An integrated circuit package as recited in claim 11, wherein said second power supply voltage is a reference voltage.

14. An integrated circuit package as recited in claim 12, wherein said second power supply voltage is a reference voltage.

15. An integrated circuit package as recited in claim 10, wherein first power supply voltage connections and second power supply voltage connections are made in alternating columns.

16. An integrated circuit package as recited in claim 15, wherein said second power supply voltage connections are made in a second row from an edge of said chip connection pattern.

17. An integrated circuit package as recited in claim 16, wherein third power supply voltage connections are located at a connection location adjacent a connection location at an edge of said chip connection pattern in signal columns.

18. An integrated circuit package as recited in claim 17, further including a plurality of power redistribution wiring layers, wherein first, second and third power redistribution wiring layers nearest said chip are formed as meshes providing power redistribution wiring of said first, second and third power supply voltages, respectively.

19. An integrated circuit package as recited in claim 18, wherein said meshes extend both inside and outside a perimeter of said chip.

20. An integrated circuit package as recited in claim 15, wherein said first power supply voltage is a reference voltage.

21. An integrated circuit package as recited in claim 19, wherein said first power supply voltage is a reference voltage.

* * * * *